United States Patent
Tandon et al.

(10) Patent No.: US 7,656,975 B2
(45) Date of Patent: Feb. 2, 2010

(54) GAIN CONTROL IN SIGNAL PROCESSING WITH FEED-FORWARD GAIN CORRECTION

(75) Inventors: Tarun K. Tandon, San Diego, CA (US); Insung Kang, San Diego, CA (US)

(73) Assignee: VIA Telecom Co., Ltd., San Diego, CA (US)

( * ) Notice: Subject to any disclaimer, the term of this patent is extended or adjusted under 35 U.S.C. 154(b) by 447 days.

(21) Appl. No.: 11/055,009

(22) Filed: Feb. 10, 2005

(65) Prior Publication Data

US 2006/0176985 A1     Aug. 10, 2006

(51) Int. Cl.
    *H04L 27/08*     (2006.01)
(52) U.S. Cl. .................. 375/345; 375/320; 375/233; 375/297; 375/232
(58) Field of Classification Search .......... 375/345, 375/320, 233, 297, 232
See application file for complete search history.

(56) References Cited

U.S. PATENT DOCUMENTS

| 2003/1002636 | * | 2/2003 | Stoter et al. | 375/345 |
| 2003/0156666 A1 | * | 8/2003 | Nichols | 375/345 |
| 2004/0037378 A1 | * | 2/2004 | Komori et al. | 375/345 |
| 2004/0141571 A1 | * | 7/2004 | Nagano | 375/345 |

* cited by examiner

*Primary Examiner*—Shuwang Liu
*Assistant Examiner*—Kabir A Timory
(74) *Attorney, Agent, or Firm*—K&L Gates LLP

(57) ABSTRACT

A method and system is disclosed for providing an automatic gain control in signal processing. After receiving a stream of analog signals, a gain is adjusted on the received analog signals using a first set of gain compensation parameters. Then, the adjusted analog signals are converted to digital signals. A predetermined number of digital signals are collected from the converted digital signals within a predetermined time period. The collected digital signals are delayed from being transferred out for further demodulation processing for a predetermined delay time. At the same time, a second set of gain compensation parameters are estimated based on the collected digital signals. The estimated second set of gain compensation parameters are applied to the delayed digital signals.

19 Claims, 3 Drawing Sheets

GAIN CONTROL IN SIGNAL PROCESSING WITH FEED-FORWARD GAIN CORRECTION

BACKGROUND

The present invention relates generally to automatic gain control (AGC) in communication devices, and more particularly to the improvement of AGC feedback systems using a feed forward scheme.

AGC is a signal processing technique used to dynamically compensate for widely-varying channel gains encountered in various wireless and wire-line media at the receiver end. The strength of the wanted signal fluctuates because of changes in propagation conditions. Such conditions include the distance between transmitter and receiver, traveling medium such as air, wire or fiber optics, and the ambient noise around the medium. A receiver therefore includes AGC to maintain the signal at the input to a detector at a constant value despite fluctuations in the signal strength of the antenna or receiver. In a traditional approach, the AGC block forms a loop by estimating the received signal strength at an output by using a peak detector. The AGC adjusts the gain, negatively or positively, so as to bring the further received signal strength to a specified target peak value.

The process of adjusting the gain for incoming signals by processing older signals has its disadvantages. While the signal is being processed, a delay is introduced. This delay could severely affect newer incoming signals. Such delays could also render incoming data erroneous, as the gain for the incoming signal might be too much or too little. Additionally, if the peaks of incoming signals vary rapidly within a given period, the delay of the AGC might completely miss the erratic signal and thus make the data incorrect. Given that digital communications typically require a fast transfer rate, the problem described above is critical and must be promptly addressed.

Desirable in the art of automatic gain control designs are additional designs that provide a gain compensation mechanism to thereby reduce or eliminate the possibility of erroneous data detection.

SUMMARY

In view of the foregoing, the following provides a system to enhance an AGC system, and more specifically, to reduce or eliminate the possibility of erroneous data detection by means of multiple signal comparisons and signal synchronization.

In one embodiment, a system is provided to reduce or eliminate the possibility of erroneous data detection by means of a gain compensation mechanism. In one embodiment, after receiving a stream of analog signals, a gain is adjusted on the received analog signals using a first set of gain compensation parameters. Then, the adjusted analog signals are converted to digital signals. A predetermined number of digital signals are collected from the converted digital signals within a predetermined time period. The collected digital signals are delayed from being transferred out for further demodulation processing for a predetermined delay time. At the same time, a second set of gain compensation parameters are estimated based on the collected digital signals. The estimated second set of gain compensation parameters are applied to the delayed digital signals. This invention provides less saturation noise, more constant signal constellation, and accurate detection of the signal samples received right after a sudden change in signal conditions.

The construction and method of operation of the invention, however, together with additional objects and advantages thereof will be best understood from the following description of specific embodiments when read in connection with the accompanying drawings.

DESCRIPTION

The following detailed description provides illustration for an improved system to reduce or eliminate the possibility of erroneous data detection by means of a gain compensation mechanism.

Figure 1A:
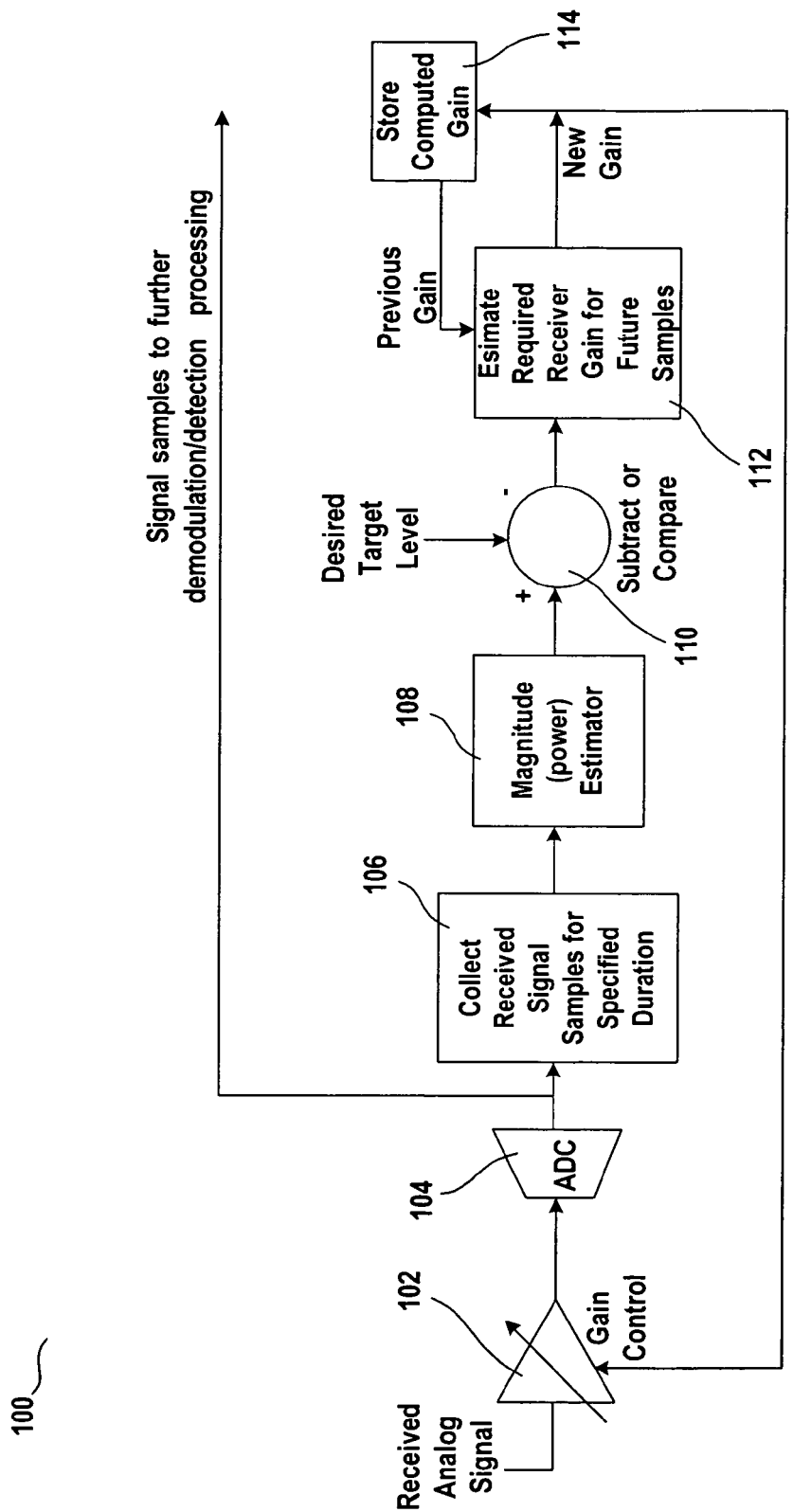
FIG. 1A presents a conventional AGC processor.

FIG. 1A presents a conventional AGC processor 100. In order to transmit digital data over a medium, the data must be converted into an analog signal. While the signal is being transmitted, its power may be lost. The power loss depends on the properties of the medium. When the analog signal is detected at the receiver, it is amplified by a variable amplifier 102 to compensate for power loss. The amplification can be negative or positive, and can vary between values. To analyze and recover the digital data in the analog signal the signal goes through an analog-to-digital converter (ADC) 104. The ADC is an electronic device that converts analog signals into digital signals, which are a series of discrete numbers. Once the analog signal samples have been converted, they are sent to further processing. One processing path leads to a demodulation/detection process that extracts the data from the samples. The demodulation process may involve digital filters and will usually be done by a digital signal processor. The signal also leads to further AGC processing.

Once the signal has been converted, a collection of received signal samples is stored temporarily for a specific duration in a collection module 106. The collection module 106 is required since the output of the ADC 104 is a string or a series of raw amplitude values. The size of the collection buffer may be related to the frequency of the signal as well as the sampling rate of the ADC 104. The magnitude or power of the signal is then estimated in an estimator module 108. The estimator module 108 is similar to a peak detector in that it finds the highest magnitude in a given sample. Since the signal is now digital, the process involves searching for the highest value of the sample. The value provided in the estimator module 108 is then algebraically compared to a desired target level in a comparator module 110. The target level can vary from system to system and may be adjusted dynamically. For example, if the highest magnitude of a sample is "112" and the desire target level is "150", the comparator output would be −38. In other words, the desired target level is subtracted from the highest magnitude of the sample. It is understood that the comparison needs not be linear. Once the signal has been algebraically compared, it is compared again with the values of previous comparisons in a second comparator or estimator module 112, which essentially is used to estimate the required receiver gain for future samples. By comparing the current signal conditions with previous signal conditions, the required gain at the variable amplifier 102 can be adjusted. Additionally, the gain level is stored for comparison with the next signal level in a storage module 114. For example, the previous gain value stored in the storage module 114 was "−51", while the current calculated value from the comparator module 110 is "−38". The difference between the old value and the new value is now "13", which means that the variable amplifier 102 needs to be adjusted by "13" units.

Figure 1B:
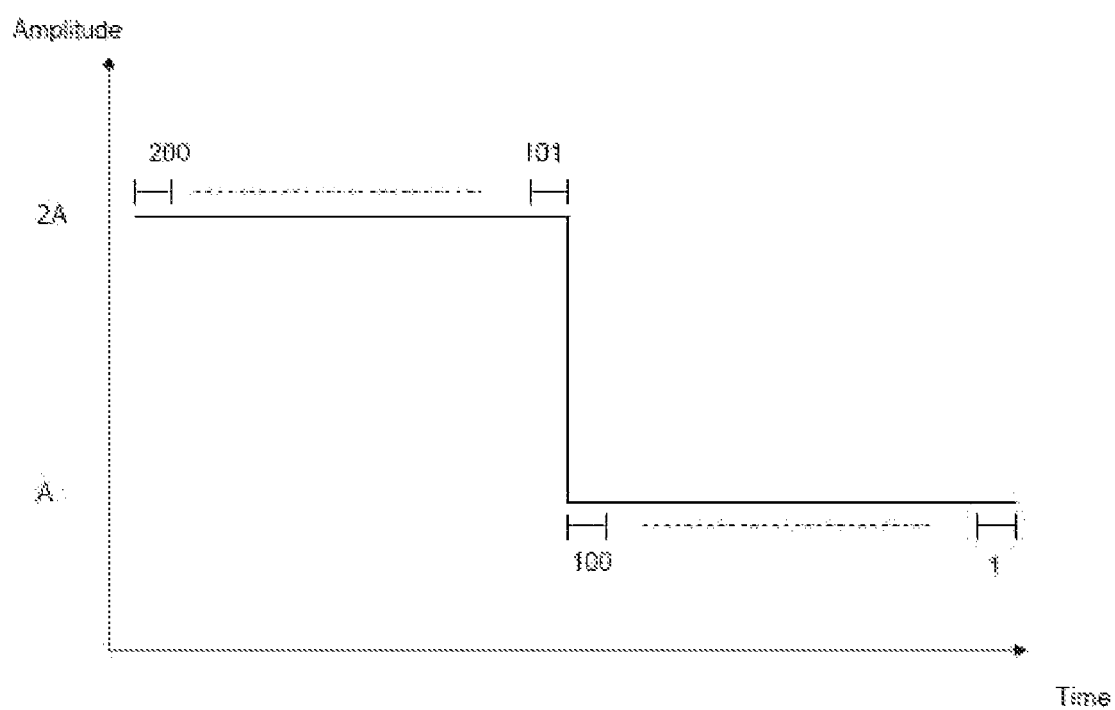
FIG. 1B presents a series of data frames with a change of magnitude.

This conventional processor 100 has a great disadvantage. The initial group of signal samples after a sudden change in signal conditions, e.g. in case of an abrupt power change in the discontinuous-transmission (DTX) or in fast fading conditions, are not properly compensated for the new signal conditions before being processed by demodulation and detection blocks, and thereby have a higher probability of erroneous detection. As shown in FIG. 1B, if a series of frames of signal are arriving, the first 100 frames (e.g., frames 1-100) are at an amplitude level of "A", but the following frames (e.g., frames 101-200) rise up to a much higher level of "2A" in this particular case. Assuming each 100 frames are examined to estimate and correct the gain, due to the abrupt change of the power level, the conventional method can not deal with the changes appropriately, therefore asserting wrong gain control.

Figure 2:
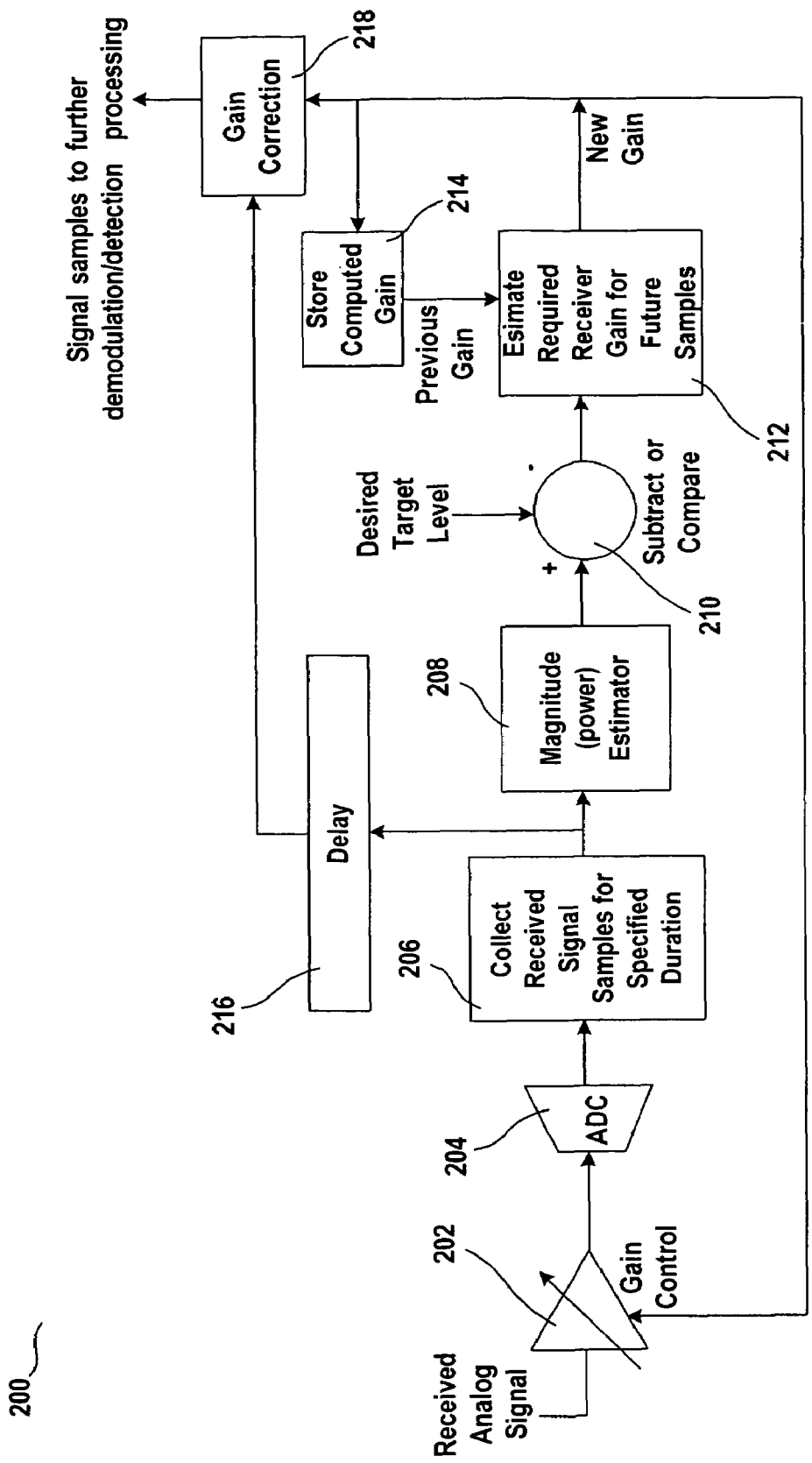
FIG. 2 presents an improved AGC processor with a feed-forward gain correction in accordance with one embodiment of the present invention.

FIG. 2 presents an improved AGC processor 200 with a feed-forward gain correction in accordance with one embodiment of the present invention. Similar to the conventional processor 100, the processor 200 has a gain controller 202 and an ADC 204. The gain controller 202 first applies gain compensation parameters to the received signals. At this moment, the gain compensation parameters are derived from the data received in the past. A collection module 206 temporarily stores received signal samples, which are not instantaneously passed over to further demodulation/detection processing blocks. Once enough signal samples have been collected, the signal samples set takes two directions. As will be described in detail below, one direction leads to further demodulation/detection processing, while another direction leads to further AGC processing.

The magnitude or power of the signal is then estimated in an estimator module 208, which operates in a similar fashion as the estimator module 108. The value provided by the estimator module 208 is then algebraically compared to a desired target level in a comparator module 210. Once the signal has been algebraically compared with a target level, the result feeds into a second comparator/estimator module 212, and it is compared again with the value of the previous gain stored in a storage module 214. The estimator module 212 has filters included therein for producing a new gain, which is fed back to the gain controller 202 for parameter adjusting for new incoming signals. At the same time, the new gain is stored in the storage module 214 for future comparisons.

Additionally, the collected signal sample from block 206 goes through another process. A delay time period is intentionally introduced in a delay module 216 to compensate for the processing time taken by the AGC processing from the modules 208, 210, and 212. The delay module 216 is needed in order to synchronize the signal with the computed AGC gain for use in a gain correction module 218. In some situations, even if the delay time period does not perfectly match the time period needed for the processing time of the magnitude estimator 208, the comparator module 210, and the estimator module 212, the finer gain control implemented by the gain correction module 218 is still an improvement upon the conventional approach because at least a part of the data currently under processing has been considered for generating the gain compensation parameters. The delay time can also be obtained by using simulation tools to more accurately estimate the duration of the processing time needed.

Any gain compensation parameters computed by the feedback gain control loop or the feedback gain control module (including the modules 208, 210, 212, and 214) based on this collection of signal samples is also used to correct the gain of the delayed signal samples, which have been gain controlled by using previous gain compensation parameters. The gain correction module 218 can deal with the gain control either in a linear domain or a log domain. If a log domain is used, some look-up tables may have to be implemented to convert data from the log domain to the linear domain. The route for extracting the data from block 206, delaying it in the delay module 216, and further feeding into the gain correction module 218 is referred to as the feed-forward gain control loop. Contrasting with the conventional method in which a gain compensation based on a previous set of signal samples are used to process a current set of signal samples, this feed-forward gain control loop provides a finer gain compensation because the same set of signal samples are used as a base to obtain the estimated gain.

In essence, this invention proposes a novel procedure in order to reduce incorrect signal gain. By adding a feed-forward gain control loop, an improved gain compensation on received signal can be achieved such as in fast changing channel conditions and/or in discontinuous transmissions. Improvement to the AGC performance provides an increase in valid transmissions under faster transfer rates. Additionally, an improved control of the signal magnitude results in less saturation noise and more constant signal constellation. Finally, probability of accurate detection of the signal samples received right after a sudden change in channel conditions is improved.

One significant advantage of the embodiment of this invention is that the signal to be demodulated and detected is with a finer gain, thereby resulting in less saturation noise. This compensation is critical since demodulation and detection extract the data from the signal and pass said data to other systems. An incorrect gain in the raw values of the sampled signal could lead to false detection or erroneous data. Additionally, since the flow is delayed, fast changing signals do not affect the system as the AGC gain and modulation scheme gain are synchronized, thereby leading to more constant signal constellation.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A method for providing an automatic gain control in signal processing, the method comprising:
  receiving a stream of analog signals;
  adjusting a gain on the received analog signals using a first set of gain compensation parameters derived from previously received signals;
  converting the adjusted analog signals to digital signals;
  collecting a predetermined number of digital signals from the converted digital signals within a predetermined time period;

delaying the collected digital signals from being transferred out for further demodulation processing for a predetermined delay time;

estimating a second set of gain compensation parameters based on the collected digital signals;

applying the estimated second set of gain compensation parameters to the delayed collected digital signals for compensating a gain of the delayed collected digital signals; and providing the delayed collected digital signals with the gain compensated based on non-delayed collected digital signals to demodulation and detection blocks, wherein the non-delayed digital signals are the second set of gain compensation parameters, and wherein the delayed collected digital signals are not directly provided for adjusting the gain on the received analog signals.

2. The method of claim 1 wherein the delaying further includes storing the collected digital signals temporally.

3. The method of claim 1 wherein the first set of gain compensation parameters are derived from digital signals received in another time period immediately prior to the predetermined time period for collecting the predetermined number of digital signals.

4. The method of claim 1 wherein the estimating further includes:

estimating at least one magnitude of the collected digital signals;

comparing the estimated magnitude with at least one predetermined target level to provide a comparison result; and generating the second set of gain compensation parameters based on a previous stored gain value and the first set of gain compensation parameters.

5. The method of claim 1 wherein the predetermined delay time is adjustable based on signal processing time needed for estimating the second set of gain compensation parameters.

6. The method of claim 5 wherein the predetermined delay time is determined based on simulation for determining the signal processing time.

7. A method for providing an automatic gain control in signal processing, the method comprising:

receiving a stream of analog signals;

providing a feedback loop for deriving a first set of gain compensation parameters based on a first set of digital signals obtained from the received analog signals;

adjusting a gain on the received analog signals using the first set of gain compensation parameters;

deriving a second set of gain compensation parameters from the feedback loop based on a second set of digital signals received after the first set of digital signals, wherein the analog signals corresponding to the second set of digital signals having been adjusted by using the first set of gain compensation parameters;

collecting a predetermined number of the second set of digital signals;

delaying the collected digital signals from being transferred out for further demodulation processing for a predetermined delay time;

applying the second set of gain compensation parameters to the delayed collected digital signals for compensating a gain of the delayed collected digital signals; and providing the delayed collected digital signals with the gain compensated based on non-delayed collected digital signals to demodulation and detection blocks, wherein the non-delayed digital signals are the second set of gain compensation parameters, and wherein the delayed collected digital signals are not directly provided for adjusting the gain on the received analog signals.

8. The method of claim 7 further comprising:

converting the analog signals to digital signals after the gain is adjusted; and collecting a predetermined number of digital signals from the converted digital signals within a predetermined time period.

9. The method of claim 7 wherein the providing a feedback loop further includes:

estimating at least one magnitude of the collected digital signals;

comparing the estimated magnitude with at least one predetermined target level to provide a comparison result; and generating the second set of gain compensation parameters based on a previous stored gain value and the first set of gain compensation parameters.

10. The method of claim 7 wherein the predetermined delay time is adjustable based on signal processing time needed for deriving the second set of gain compensation parameters.

11. The method of claim 10 wherein the predetermined delay time is determined based on simulation for determining the signal processing time.

12. An automatic gain control circuit for signal processing comprising:

a gain control module for adjusting a gain on a series of analog signals using a first set of gain compensation parameters;

an analog-to-digital converter for converting the adjusted analog signals to digital signals;

a collection module for collecting a predetermined number of digital signals from the converted digital signals within a predetermined time period;

a delay module for delaying the collected digital signals from being transferred out for further demodulation processing for a predetermined delay time, wherein the delayed collected digital signals are not directly provided for adjusting the gain on a series of analog signals received at the gain control module;

a feed back processing module for estimating a second set of gain compensation parameters based on the collected digital signals, said feed back processing module is coupled to the gain control module; and a gain correction module for receiving the second set of gain compensation parameters from said feed back processing module and applying the estimated second set of gain compensation parameters to the delayed collected digital signals for compensating a gain of the delayed collected digital signals and providing the delayed collected digital signals with compensated gain to demodulation and detection blocks.

13. The circuit of claim 12 wherein the first set of gain compensation parameters are derived from digital signals received in another time period immediately prior to the predetermined time period for collecting the predetermined number of digital signals.

14. The circuit of claim 12 wherein the feed back processing module further includes:

a magnitude estimator for estimating at least one magnitude of the collected digital signals;

a comparator module for comparing the estimated magnitude with at least one predetermined target level to provide a comparison result;

a memory for storing a previous gain value; and an estimator module for generating the second set of gain compensation parameters based on the previous gain value and the first set of gain compensation parameters.

15. The circuit of claim 12 wherein the predetermined delay time is adjustable based on signal processing time needed for estimating the second set of gain compensation parameters.

16. The circuit of claim 15 wherein the predetermined delay time is determined based on simulation for determining the signal processing time.

17. An automatic gain control circuit for signal processing comprising:
- a gain control module for adjusting a gain on a series of analog signals using a first set of gain compensation parameters derived from previously received signals;
- an analog-to-digital converter for converting the adjusted analog signals to digital signals;
- a feed back processing module for estimating a second set of gain compensation parameters based on the collected digital signals, said feed back processing module being coupled to the gain control module;
- a feed forward loop for fine gain compensation using the digital signals, the feed forward loop further comprising:
- a collection module for collecting a predetermined number of digital signals from the converted digital signals within a predetermined time period;
- a delay module for delaying the collected digital signals from being transferred out for further demodulation processing for a predetermined delay time, wherein the delayed collected digital signals are not directly provided for adjusting the gain on a series of analog signals received at the gain control module; and
- a gain correction module for receiving the second set of gain compensation parameters from said feed back processing module and compensating a gain of the delayed collected digital signals and providing the delayed collected digital signals with compensated gain to demodulation and detection blocks.

18. The circuit of claim 17 wherein the first set of gain compensation parameters are derived from digital signals received in another time period immediately prior to the predetermined time period for collecting the predetermined number of digital signals.

19. The circuit of claim 17 wherein the feed back processing module further includes:
- a magnitude estimator for estimating at least one magnitude of the collected digital signals;
- a comparator module for comparing the estimated magnitude with at least one predetermined target level to provide a comparison result;
- a memory for storing a previous gain value; and
- an estimator module for generating the second set of gain compensation parameters based on the previous gain value and the first set of gain compensation parameters.

* * * * *